US012504474B2

(12) United States Patent
Xia et al.

(10) Patent No.: US 12,504,474 B2
(45) Date of Patent: Dec. 23, 2025

(54) TEST BUTTON LOOP DEVICE AND CIRCUIT BREAKER

(71) Applicant: ZHEJIANG CHINT ELECTRICS CO., LTD., Zhejiang (CN)

(72) Inventors: Xiaomin Xia, Zhejiang (CN); Xiaohai Chen, Zhejiang (CN); Jie Li, Zhejiang (CN); Yanqiang Wu, Zhejiang (CN)

(73) Assignee: ZHEJIANG CHINT ELECTRICS CO., LTD. (CN)

( * ) Notice: Subject to any disclaimer, the term of this patent is extended or adjusted under 35 U.S.C. 154(b) by 175 days.

(21) Appl. No.: 18/557,214

(22) PCT Filed: Aug. 16, 2022

(86) PCT No.: PCT/CN2022/112637
§ 371 (c)(1),
(2) Date: Oct. 25, 2023

(87) PCT Pub. No.: WO2023/138041
PCT Pub. Date: Jul. 27, 2023

(65) Prior Publication Data
US 2024/0201259 A1 Jun. 20, 2024

(30) Foreign Application Priority Data
Jan. 21, 2022 (CN) ......................... 202210072506.8

(51) Int. Cl.
*G01R 31/327* (2006.01)
*H01H 71/12* (2006.01)

(52) U.S. Cl.
CPC ..... *G01R 31/3272* (2013.01); *G01R 31/3275* (2013.01); *H01H 71/12* (2013.01)

(58) Field of Classification Search
None
See application file for complete search history.

(56) References Cited

U.S. PATENT DOCUMENTS 4,387,356 A * 6/1983 Takemura .............. H01H 71/52 335/26
6,285,534 B1 * 9/2001 Gibson .................. H01H 83/04 361/42
(Continued)

FOREIGN PATENT DOCUMENTS

CN 1056372 A 11/1991
CN 106257295 A 12/2016
(Continued)

OTHER PUBLICATIONS

English Translation of CN 207184184 U (Year: 2018).*
(Continued)

*Primary Examiner* — Jermele M Hollington
(74) *Attorney, Agent, or Firm* — OSTROLENK FABER LLP

(57) ABSTRACT

A test button loop device that includes an elastic button and a conductive member forming a test loop. The elastic button includes a contact portion matched with the conductive member, and a button member pressing the contact portion. The conductive member is linked with a handle mechanism or an operating mechanism or a moving contact of a circuit breaker, which drives the conductive member to approach the contact portion when the circuit breaker is closed, and the button member in this state can drive the contact portion to contact the conductive member to switch the test loop on. The handle mechanism or the operating mechanism or the moving contact of the circuit breaker drives the conductive member away from the contact portion when the circuit breaker is opened, and the button member in this state can will not be able to contact the conductive member.

10 Claims, 3 Drawing Sheets

(56) References Cited

U.S. PATENT DOCUMENTS

| | | | | | |
|---|---|---|---|---|---|
| 6,639,492 | B1 * | 10/2003 | Hall | H01H 71/04 200/334 |
| 6,710,687 | B2 * | 3/2004 | Elms | H01H 83/04 335/7 |

FOREIGN PATENT DOCUMENTS

| | | | | |
|---|---|---|---|---|
| CN | 206601475 | U | | 10/2017 |
| CN | 207183184 | U | * | 4/2018 |
| CN | 209388991 | U | | 9/2019 |
| CN | 217061822 | U | | 7/2022 |
| CN | 218101143 | U | * | 12/2022 |

OTHER PUBLICATIONS

English translation of CN 218101143 U (Year: 2022).*
International Search Report mailed Oct. 28, 2022 in corresponding PCT International Application No. PCT/CN2022/112637.

* cited by examiner

TEST BUTTON LOOP DEVICE AND CIRCUIT BREAKER

CROSS-REFERENCE TO RELATED APPLICATIONS

The present application is a 35 U.S.C. §§ 371 national stage application of International Application No. PCT/CN2022/112637, filed Aug. 16, 2022, which claims priority to Chinese Patent Application No. 202210072506.8, filed Jan. 21, 2022, the contents of which are incorporated herein by reference.

TECHNICAL FIELD

The present invention relates to the technical field of low-voltage electrical appliances, and more particularly to a test button loop device and a circuit breaker.

BACKGROUND ART

All residual current operated circuit breakers are equipped with test button loop devices for detecting whether a leakage protection function of the circuit breaker is normal. At present, the test button loop devices are divided into a single-break-point structure and a double-break-point structure. In the single-break-point structure, when the circuit breaker is in a opened position, because a wire incoming end is connected to a power supply, there will be an induced voltage at a wire outgoing end after a test button is pushed, resulting in a potential safety hazard of personal electric shock; and in the double-break-point structure, a break point linked with a circuit breaker mechanism is additionally provided to solve the problem of induced voltage at the wire outgoing end, but the difficulty of the production process is increased and the assembly efficiency is reduced.

SUMMARY OF THE INVENTION

An objective of the present invention is to overcome the defects of the prior art and provide a test button loop device and a circuit breaker which have a simple structure and high reliability.

In order to achieve the above object, the technical scheme adopted in the present invention is as follows:

A test button loop device, comprising an elastic button and a conductive member which form a test loop, wherein the elastic button comprises a contact portion matched with the conductive member, and a button member pressing the contact portion; the conductive member is in linkage with a handle mechanism or an operating mechanism or a moving contact of a circuit breaker; the handle mechanism or the operating mechanism or the moving contact of the circuit breaker drives the conductive member to approach the contact portion when the circuit breaker is closed, and the button member at this time is pressed to drive the contact portion to move and can contact the conductive member; and the handle mechanism or the operating mechanism or the moving contact of the circuit breaker drives the conductive member to move away from the contact portion when the circuit breaker is opened, and the button member at this time is pressed to drive the contact portion to move will not be able to contact the conductive member.

Further, the conductive member is rotatably assembled in a shell of the circuit breaker, and a first end of the conductive member is in linkage with the handle mechanism or the operating mechanism or the moving contact of the circuit breaker, such that a second end of the conductive member moves close to the contact portion in a closed state, and moves away from the contact portion in a opened state.

Further, a limiting groove is formed in the shell, and the second end of the conductive member swings within the limiting groove.

Further, a limiting boss is disposed in the shell and located above the second end of the conductive member, and the contact portion is in sliding fit with the limiting boss.

Further, the inner sidewall of the shell is provided with a first limiting portion, the elastic button is provided with a second limiting portion, and the first limiting portion and the second limiting portion cooperate to limit a pressing stroke of the elastic button.

Further, the test button loop device further comprising a test resistor, wherein the conductive member is electrically connected to a wiring terminal of the circuit breaker through a test resistor, and the contact portion is electrically connected to the other wiring terminal of the circuit breaker.

Further, the conductive member comprises a torsion spring; a main body of the torsion spring is rotatably assembled in the shell; one end of the test resistor is connected to the main body of the torsion spring; both ends of the main body extend respectively to both sides of the main body to form the first end of the conductive member and the second end of the conductive member; and the first end of the conductive member is bent to form a ring structure, and the second end of the conductive member is bent towards one side of the shell.

Further, the elastic button comprises a conductive spring pressed by the button member, one end of the conductive spring is electrically connected to the wiring terminal of the circuit breaker through a wire, and the other end of the conductive spring extends to one side to form the contact portion, and the contact portion is located above the conductive member.

Further, the button member comprises an operating portion, a connecting portion and a pressing portion which are integrally formed; the operating portion is in sliding fit with a button hole of the shell and extends out of the shell; the connecting portion and the pressing portion are connected to one end of the operating portion located in the shell; the connecting portion extends in a direction parallel to a central axis of the button hole and is connected to one end of the conductive spring to press the conductive spring; the pressing portion extends in a direction perpendicular to the central axis of the button hole; the pressing portion is in limiting fit with the contact portion to press the contact portion; and a boss which serves as the second limiting portion is disposed to protrude from the middle of the pressing portion.

Further, the operating mechanism comprises a lever, and a jump buckle and a lock buckle which are rotatably assembled on the lever; the jump buckle is in locking fit with the lock buckle; and a convex shaft is disposed on the lock buckle and is in linkage with the first end of the conductive member via the convex shaft.

A circuit breaker, comprising a shell and at least two circuit breaker poles, the test button loop device is also disposed in the shell, one end of the test loop is connected to a wire incoming end of one circuit breaker pole, and the other end of the test loop is connected to a wire outgoing end of the other circuit breaker pole.

Further, the test button loop device and the handle mechanism of the circuit breaker are disposed at the upper part of the shell, the conductive member is rotatably assembled between the handle mechanism and the elastic button, and the test resistor is disposed on one side of the conductive member away from the elastic button.

The test button loop device of the present invention only has a break point formed by a contact portion and a conductive member. With the opening and closing actions of the circuit breaker to make the conductive member moved, the elastic button may be pressed to connect the test loop when the circuit breaker is closed, but not to connect the test loop when the circuit breaker is opened. Therefore, the test button loop device has a protection effect of a double-break-point structure, which can prevent the live-working problem after opening caused by reverse wiring, and also has the advantages of simple structure, high assembly efficiency and high reliability of a single-break-point structure.

In addition, the conductive member is mounted rotatably, and swings with the opening and closing actions of the circuit breaker through the second end of the conductive member, and the distance between the second end of the conductive member and the contact portion is adjusted, so that the contact portion is in cooperation and contact with the second end of the conductive member in the closing state, and but is not in contact with the second end of the conductive member in the opening state, thereby further simplifying its structure and improving the reliability.

In addition, the shell is provided with a limiting groove which limits a movement trajectory of the second end of the conductive member, thereby improving the degree of cooperation between the contact portion and the conductive member.

In addition, the first limiting portion and the second limiting portion cooperate to limit a pressing stroke of the elastic button, which avoids the inconvenience in operation caused by an excessively long pressing stroke of the elastic button, and also ensures that the elastic button cannot contact the second end of the conductive member in a opened state.

The circuit breaker of the present invention adopts the test button loop device with simple structure and high safety, which simplifies the assembly difficulty of the circuit breaker and is conducive to reducing the volume of the circuit breaker.

DETAILED DESCRIPTION OF THE PREFERRED EMBODIMENTS

Figure 1:
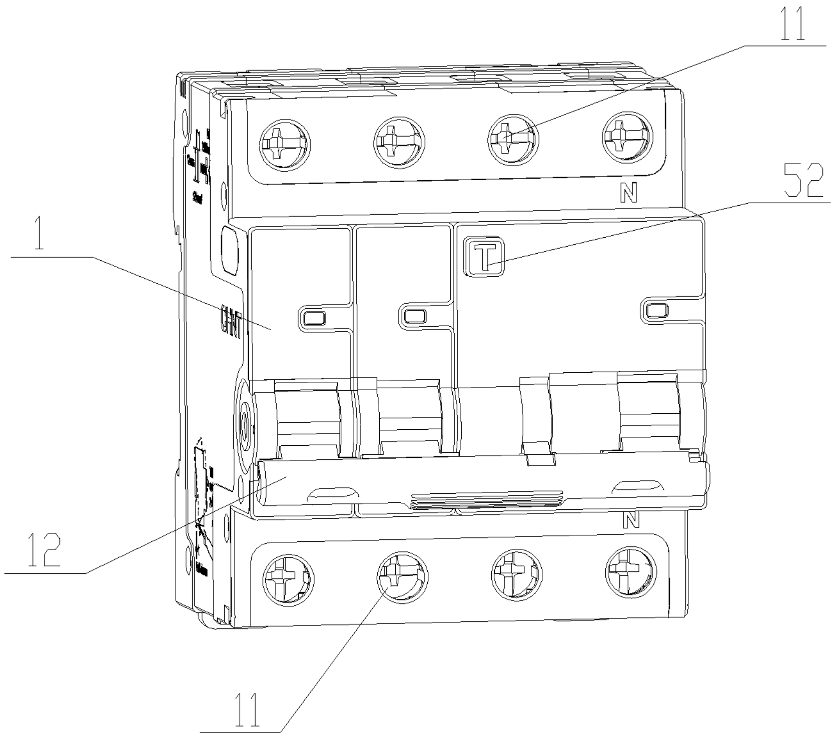
FIG. 1 is a schematic structural diagram of a circuit breaker in the present invention.

The specific implementation of a test button loop device and a circuit breaker of the present invention will be further described below with reference to the embodiments given in FIGS. 1 to 5. The test button loop device and the circuit breaker of the present invention are not limited to the description of the following embodiments.

A test button loop device, comprising an elastic button and a conductive member 4 which form a test loop, wherein the elastic button comprises a contact portion 511 matched with the conductive member 4, and a button member 52 pressing the contact portion 511; the conductive member 4 is in linkage with a handle mechanism 12 or an operating mechanism 13 or a moving contact 141 of a circuit breaker; the handle mechanism 12 or the operating mechanism 13 or the moving contact 141 of the circuit breaker drives the conductive member 4 to approach the contact portion 511 when the circuit breaker is closed, and the button member 52 at this time is pressed to drive the contact portion 511 to move, and the contact portion 511 can contact the conductive member 4 for the test loop to be switched on; and the handle mechanism 12 or the operating mechanism 13 or the moving contact 141 of the circuit breaker drives the conductive member 4 to move away from the contact portion 511 when the circuit breaker is opened, and the button member 52 at this time is pressed to drive the contact portion 511 to move and the contact portion 511 will not be able to contact the conductive member 4.

The test button loop device of the present invention only has a break point formed by a contact portion 511 and a conductive member 4. With the opening and closing actions of the circuit breaker to make the conductive member 4 moved, the elastic button may be pressed to connect the test loop when the circuit breaker is closed, but not to connect the test loop when the circuit breaker is opened. Therefore, the test button loop device has a protection effect of a double-break-point structure, which can prevent the live-working problem after opening caused by reverse wiring, and also has the advantages of simple structure, high assembly efficiency and high reliability of a single-break-point structure.

An embodiment of a circuit breaker is provided in conjunction with FIGS. 1 to 5. The circuit breaker includes a shell. At least two circuit breaker poles 1 are disposed in parallel in the shell. Each circuit breaker pole 1 includes wiring terminals 11 disposed at both ends. The two wiring terminals 11 form wiring terminals of the circuit breaker. Specifically, one of the wiring terminals 11 serves as aa wire incoming end, the other wiring terminal 11 serves as a wire outgoing end, and the wire incoming (outgoing) ends of adjacent two circuit breaker poles 1 are located on the same side. In addition, each circuit breaker pole 1 may separately be provided with a phase pole shell, and all the phase pole shells are spliced to form the shell of the circuit breaker. Alternatively, two adjacent circuit breaker poles 1 are be separated by a partition plate 2. A base, an upper cover and at least one partition plate 2 together form the shell of the circuit breaker.

Figure 4:
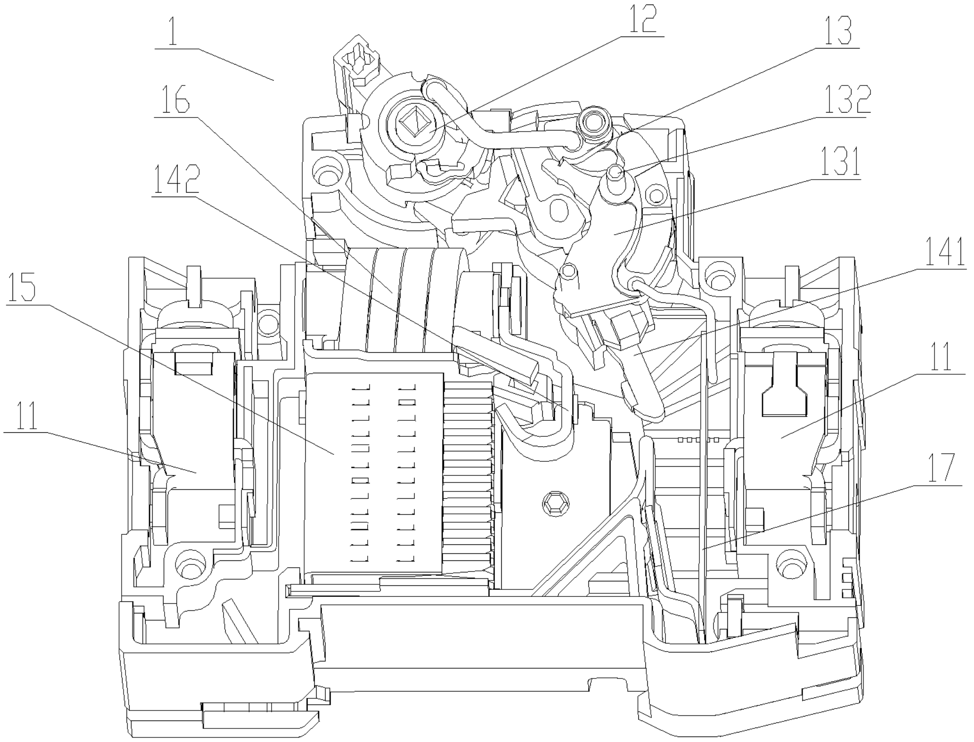
FIG. 4 is a schematic structural diagram of a circuit breaker pole in the present invention.

At least one of the circuit breaker poles 1 is also provided with a handle mechanism 12, an operating mechanism 13, a contact mechanism, an arc extinguishing system 15, a short-circuit protection mechanism 16 and an overload protection mechanism 17. As shown in FIG. 4, the handle mechanism 12 is in linkage connection with the operating mechanism 13 and disposed at the upper part of the circuit breaker pole 1; the contact mechanism includes a moving contact 141 and a static contact 142 that cooperate with each other; the moving contact 141 is connected to the lower part of the operating mechanism 13; the static contact 142 and the arc extinguishing system 15 are fixed in the middle of this circuit breaker pole 1; the moving contact 141 and the static contact 142 are connected to two wiring terminals 11, respectively; the short-circuit protection mechanism 16 is disposed between the handle mechanism 12 and the arc extinguishing system 15; the overload protection mechanism 17 is disposed between one wiring terminal 11 and the moving contact 141; and one end of the short-circuit protection mechanism 16 and a movable end of the overload protection mechanism 17 are opposite to the operating mechanism 13 respectively so as to trigger the operating mechanism 13 to trip in the event of a short-circuiting or overload fault.

Specifically, the operating mechanism 13 includes a lever that is assembled rotatably, and a jump buckle, a lock buckle 131 and a contact support which are rotatably assembled on the lever; a connecting rod is connected between the jump buckle and the handle mechanism 12; the jump buckle is in locking fit with one end of the lock buckle 131; one end of the short-circuit protection mechanism 16 is opposite to the other end of the lock buckle 131; a tripping hook is also connected to the other end of the lock buckle 131, and the tripping hook is opposite to the movable end of the overload protection mechanism 17; and the moving contact 141 is connected to the lever through the contact support. In the present embodiment, the lock buckle 131 is rotatably connected to the lever via the convex shaft 132, and one end of the convex shaft 132 is convex and may extend into the adjacent circuit breaker pole 1 through an avoidance hole formed in the partition plate 2 or phase pole shell, so that the lock buckles 131 of the adjacent two circuit breaker poles 1 are linked by the convex shaft 132.

As shown in FIGS. 1 to 3, and 5, in the present embodiment, a test button loop device is also disposed in one circuit breaker pole 1. The test button loop device is clung to the partition plate 2 of this circuit breaker pole 1. The test button loop device includes an elastic button, a test resistor 3 and a conductive member 4 which form a test loop, wherein one end of the test loop is connected to the wire incoming end of one circuit breaker pole 1, and the other end of the test loop is connected to the wire outgoing end of the other circuit breaker pole 1. A button hole for the elastic button to be assembled slidably is formed in the upper part of the partition plate 2 of this circuit breaker pole 1. Preferably, the button hole and the handle mechanism 12 of this circuit breaker pole 1 are disposed side by side at the upper part of the partition plate 2. The conductive member 4 is rotatably assembled between the handle mechanism 12 and the elastic button, and the test resistor 3 is disposed on the side of the conductive member 4 away from the elastic button. That is, the test resistor 3 is disposed below the handle mechanism 12, the conductive member 4 is connected to one wiring terminal of the circuit breaker through the test resistor 3, and the first end of the conductive member 41 is in linkage with the operating mechanism 13. Specifically, the convex shaft 132 of the lock buckle 131 is in linkage with the first end 41 of the conductive member 41, so that the second end 42 of the conductive member 4 swings with the opening and closing actions of the circuit breaker. The elastic button includes a contact portion 511 electrically connected to the other wiring terminal of the circuit breaker, and a button member 52 for pressing the contact portion 511. In the present embodiment, one end of the test resistor 3 is welded to the wire outgoing terminal of one circuit breaker pole 1, and the contact portion 511 of the elastic button is connected to the wire incoming terminal of the other circuit breaker pole 1 through a wire. Compared with the existing double-break-point test button loop structure, the test button loop device in the present embodiment has a simple structure, occupies a small space, and is fully conducive to the formation of an internal void and also to the miniaturization design of the circuit breaker.

Figure 2:
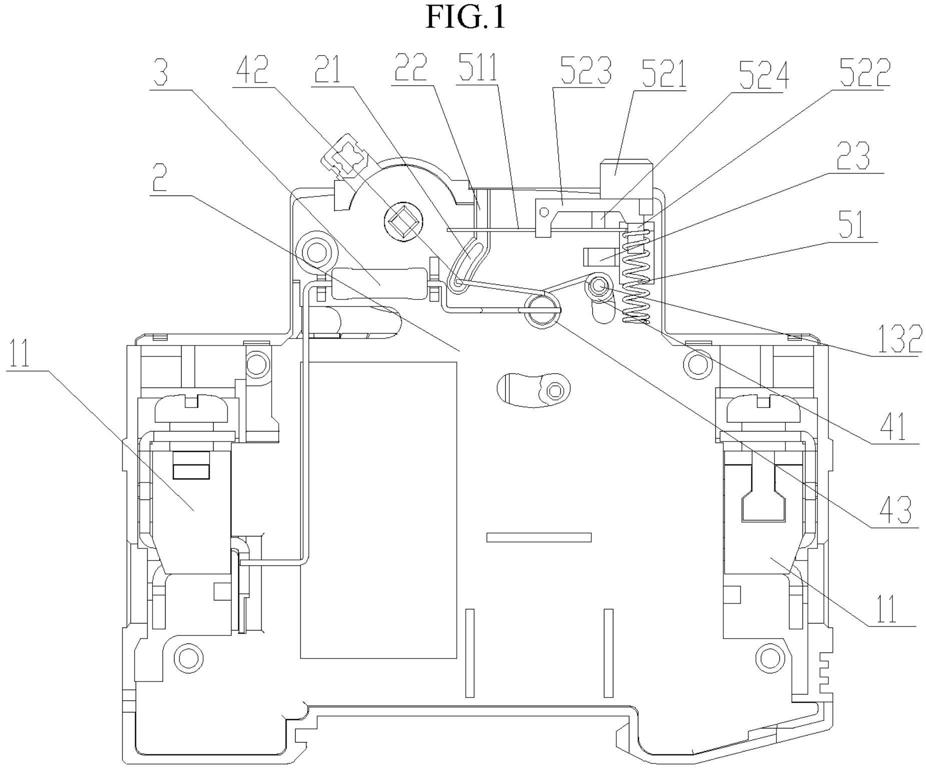
FIG. 2 is a schematic structural diagram of a test button loop device in a opened state in the present invention.
Figure 3:
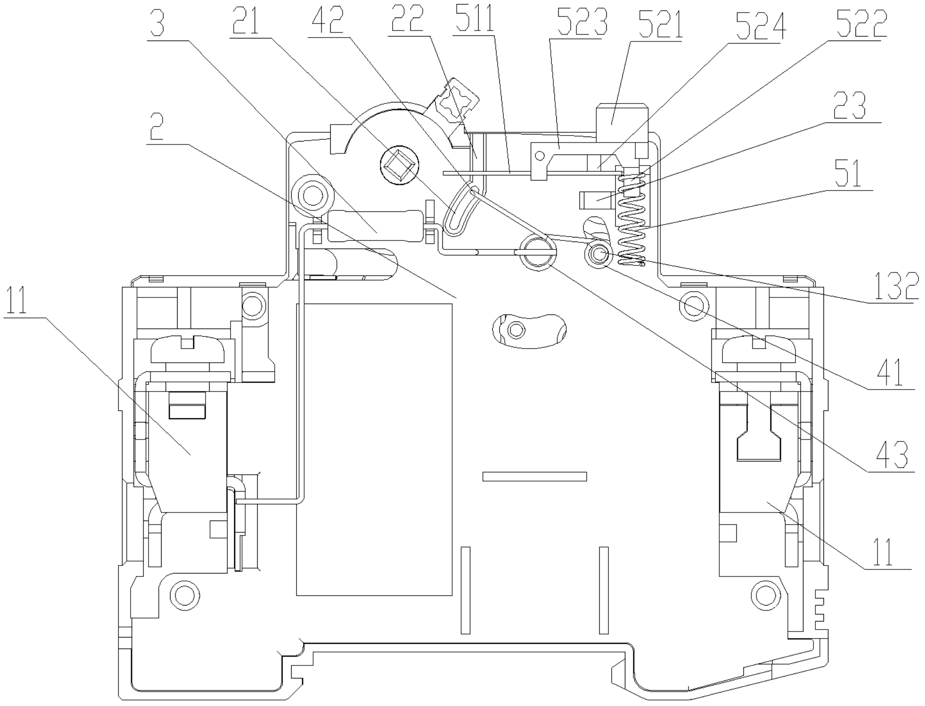
FIG. 3 is a schematic structural diagram of the test button loop device in a closed state in the present invention.

As shown in FIG. 2 and FIG. 3, the inner sidewall of a shell between the handle mechanism 12 and the elastic button (that is, the sidewall of the partition plate 2) is provided with a limiting groove 21 and a limiting boss 22, wherein the limiting groove 21 is an arc-shaped groove formed in one side of the handle mechanism 12. The second end 42 of the conductive member 4 swings in the limiting groove 21 to improve the degree of cooperation between the conductive member 4 and the elastic button. The limiting boss 22 corresponds to the upper side of the limiting groove 21, so that the contact portion 511 slides along the limiting boss 22. In FIG. 2 and FIG. 3, the limiting boss 22 is connected with the upper edge of the limiting groove 21. Of course, omitting the limiting groove 21 and/or limiting boss 22 is also applicable. In addition, a first limiting portion 23 and a second limiting portion 524 that cooperate with each other are also disposed between the elastic button and the inner sidewall of the shell. When the elastic button is pressed, the first limiting portion 23 and the second limiting portion 524 cooperate to limit a pressing stroke of the elastic button, which avoids the inconvenience in operation caused by an excessively long pressing stroke of the elastic button, and also prevents the test loop from being switched on in the opened state. Of course, by controlling the elastic deformation of the elastic button, or by controlling a spacing between the contact portion 511 and the second end 42 of the conductive member 4, the test loop can also be avoided from being switched on in the opened state.

Figure 5:
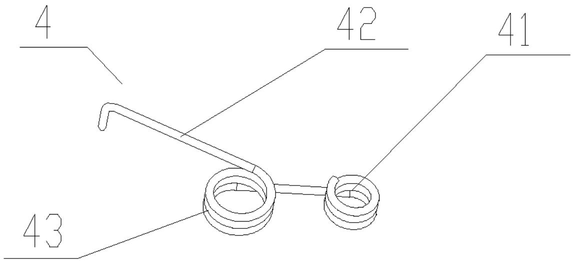
FIG. 5 is a schematic structural diagram of a conductive member in the present invention.

A structure of a conductive member 4 is provided in conjunction with FIGS. 2, 3 and 5, the conductive member 4 includes a torsion spring. A main body 43 of the torsion spring is rotatably assembled on the partition plate 2. Preferably, the partition plate 2 is provided with a connecting shaft or a connecting groove for the rotatable connection of the main body 43. One end of the test resistor 3 is connected to the main body 43 of the torsion spring. Both ends of the main body 43 extend respectively toward both sides of the main body 43 to form the first end 41 of the conductive member 4 and the second end 42 of the conductive member 4. In FIG. 2 and FIG. 3, the first end 41 of the conductive member 4 extends in a direction of the elastic button; the first end 41 of the conductive member 4 is bent to form a ring structure; the convex shaft 132 of the lock buckle 131 extends into the ring structure to drive the conductive member 4 to rotate, and the second end 42 of the conductive member 4 extends in a direction of the handle mechanism 12; and the second end 42 of the conductive member 4 is bent toward one side of the shell. Preferably, the second end 42 of the conductive member 4 extends into the limiting groove 21 and is in sliding fit with the limiting groove 21.

As shown in FIG. 2 and FIG. 3, the elastic button includes a conductive spring 51 pressed by the button member 52, one end of the conductive spring 51 is electrically connected to one wiring terminal 11 as the wire incoming end through a wire, and the other end of the conductive spring 51 extends to one side to form the contact portion 511. In the drawings, the contact portion 511 extends in the direction of the handle mechanism 12 and corresponds to the upper side of the second end 42 of the conductive member 4.

The button member 52 includes an operating portion 521, a connecting portion 522 and a pressing portion 523 which are integrally formed; the operating portion 521 is in sliding fit with a button hole of the shell and extends out of the shell; the connecting portion 522 and the pressing portion 523 are connected to one end of the operating portion 521 located in the shell; the connecting portion 522 extends in a direction parallel to a central axis of the button hole and is connected to one end of the conductive spring 51 to press the conductive spring 51; the pressing portion 523 extends in a direction perpendicular to the central axis of the button hole; the pressing portion 523 is in limiting fit with the contact portion 511 to press the contact portion 511. Preferably, the pressing portion 523 is provided with a groove structure which is clamped with the contact portion 511, and a boss which serves as the second limiting portion 524 is disposed to protrude from the middle of the pressing portion 523.

When the circuit breaker is closed, as shown in FIG. 3, the handle mechanism 12 and the operating mechanism 13 rotate clockwise, the convex shaft 132 of the lock buckle 131 drives the first end 41 of the conductive member 41 to rotate downward, and the second end 42 of the conductive member 4 swings upward along the limiting groove 21; and in this case, a distance between the conductive member 4 and the contact portion 511 is minimalized, the elastic button is pressed at this time, the conductive spring 51 is compressed, and the pressing portion 523 presses the contact portion 511 downward, so that the contact portion 511 is in contact with the second end 42 of the conductive member 4 for the test loop to be switched on. When the circuit breaker is opened, as shown in FIG. 2, the handle mechanism 12 and the operating mechanism 13 rotate counterclockwise, the convex shaft 132 of the lock buckle 131 drives the first end 41 of the conductive member 4 to rotate upward, and the second end 42 of the conductive member 4 swings downward along the limiting groove 21; and in this case, the second end 42 of the conductive member 4 moves away from the contact portion 511, and the button member 52 is pressed at this time. Even if the contact portion 511 is pressed downward, due to a long distance between the contact portion 511 and the second end 42 of the conductive member 4 and the limitations of the first limiting portion 23 and the second limiting portion 524 on a stroke of the elastic button, the contact portion 511 cannot contact the second end 42 of the conductive member 4, so that the test loop cannot be switched on.

Of course, in the present embodiment, other break points may also be provided in the test loop.

A circuit breaker in another embodiment of the present application is provided. This circuit breaker is the same as that in the above embodiment. This circuit breaker includes a shell and at least two circuit breaker poles 1, wherein one of the circuit breaker poles is provided with the same test button loop device as that in the above embodiment. However, this embodiment is different from the above embodiment is that: the first end 41 of the conductive member 4 is in linkage with the moving contact 141 of the circuit breaker, so that the second end 42 of the conductive member 4 swings with the opening and closing actions of the moving contact 141, thereby adjusting the distance between the second end 42 of the conductive member 4 and the contact portion 511.

A circuit breaker in yet another embodiment is provided. This circuit breaker is the same as that in the above embodiments. This circuit breaker includes a shell and at least two circuit breaker poles 1, wherein one of the circuit breaker poles 1 is provided with the same test button loop device as that in the above embodiments. However, this embodiment is different from the above embodiments is that: the first end 41 of the conductive member 4 is in linkage with the handle mechanism 12 of the circuit breaker, and the second end 42 of the conductive member 4 swings with the opening and closing actions of the handle mechanism 12, thereby adjusting the distance between the second end 42 of the conductive member 4 and the contact portion 511. Preferably, in this embodiment, the first end 41 of the conductive member 4 is disposed on the side close to the handle mechanism 12, the second end 42 of the conductive member 4 is disposed on the side close to the elastic button, and the length of the contact portion 511 may be appropriately shortened.

Of course, in the above three embodiments, the conductive member 4 may also adopt a conductive rod and other shapes of structures, a leaf spring or elastic members of other shapes, etc. In addition, the linkage of the convex shaft 132 of the lock buckle 131, the moving contact 141, the handle mechanism 12 or action mechanisms of the other circuit breakers with the conductive member 4 may be direct linkage or indirect linkage.

We have made further detailed description of the present invention mentioned above in combination with specific preferred embodiments, but it is not deemed that the specific embodiments of the present invention is only limited to these descriptions. A person skilled in the art can also, without departing from the concept of the present invention, make several simple deductions or substitutions, which all be deemed to fall within the protection scope of the present invention.

The invention claimed is:

1. A test button loop device, comprising an elastic button and a conductive member which form a test loop, wherein the elastic button comprises a contact portion matched with the conductive member, and a button member pressing the contact portion; the conductive member is in linkage with a handle mechanism or an operating mechanism or a moving contact of a circuit breaker; the handle mechanism or the operating mechanism or the moving contact of the circuit breaker drives the conductive member to approach the contact portion when the circuit breaker is closed, and the button member at this time is pressed to drive the contact portion to move and can contact the conductive member; and the handle mechanism or the operating mechanism or the moving contact of the circuit breaker drives the conductive member to move away from the contact portion when the circuit breaker is opened, and the button member at this time is pressed to drive the contact portion to move will not be able to contact the conductive member, wherein the conductive member is rotatably assembled in a shell of the circuit breaker, and a first end of the conductive member is in linkage with the handle mechanism or the operating mechanism or the moving contact of the circuit breaker, such that a second end of the conductive member moves close to the contact portion in a closed state, and moves away from the contact portion in an opened state, and wherein a limiting groove is formed in the shell, and the second end of the conductive member swings within the limiting groove.

2. The test button loop device according to claim 1, wherein a limiting boss is disposed in the shell and located above the second end of the conductive member, and the contact portion is in sliding fit with the limiting boss.

3. The test button loop device according to claim 1, wherein the inner sidewall of the shell is provided with a first limiting portion, the elastic button is provided with a second limiting portion, and the first limiting portion and the second limiting portion cooperate to limit a pressing stroke of the elastic button.

4. The test button loop device according to claim 1, wherein the test button loop device further comprising a test resistor, wherein the conductive member is electrically connected to a wiring terminal of the circuit breaker through the test resistor, and the contact portion is electrically connected to the other wiring terminal of the circuit breaker.

5. The test button loop device according to claim 4, wherein the conductive member comprises a torsion spring; a main body of the torsion spring is rotatably assembled in the shell; one end of the test resistor is connected to the main body of the torsion spring; both ends of the main body extend respectively to both sides of the main body to form the first end of the conductive member and the second end of the conductive member; and the first end of the conductive member is bent to form a ring structure, and the second end of the conductive member is bent towards one side of the shell.

6. The test button loop device according to claim 1, wherein the elastic button comprises a conductive spring pressed by the button member, one end of the conductive spring is electrically connected to the wiring terminal of the circuit breaker through a wire, and the other end of the conductive spring extends to one side to form the contact portion, and the contact portion is located above the conductive member.

7. The test button loop device according to claim 6, wherein the button member comprises an operating portion, a connecting portion and a pressing portion which are integrally formed; the operating portion is in sliding fit with a button hole of the shell and extends out of the shell; the connecting portion and the pressing portion are connected to one end of the operating portion located in the shell; the connecting portion extends in a direction parallel to a central axis of the button hole and is connected to one end of the conductive spring to press the conductive spring; the pressing portion extends in a direction perpendicular to the central axis of the button hole; the pressing portion is in limiting fit with the contact portion to press the contact portion; and a boss which serves as the second limiting portion is disposed to protrude from the middle of the pressing portion.

8. The test button loop device according to claim 1, wherein the operating mechanism comprises a lever, and a jump buckle and a lock buckle which are rotatably assembled on the lever; the jump buckle is in locking fit with the lock buckle; and a convex shaft is disposed on the lock buckle and is in linkage with the first end of the conductive member via the convex shaft.

9. A circuit breaker, comprising a shell and at least two circuit breaker poles, wherein the test button loop device according to claim 1 is also disposed in the shell, one end of the test loop is connected to a wire incoming end of one circuit breaker pole, and the other end of the test loop is connected to a wire outgoing end of the other circuit breaker pole.

10. The circuit breaker according to claim 9, wherein the test button loop device and the handle mechanism of the circuit breaker are disposed at the upper part of the shell, the conductive member is rotatably assembled between the handle mechanism and the elastic button, and a test resistor is disposed on one side of the conductive member away from the elastic button.

* * * * *